United States Patent

[11] 3,571,619

[72] Inventor Norman C. Dickerson, Jr.
E. Northpark, N.Y.

[21] Appl. No. 837,291

[22] Filed June 27, 1969

[45] Patented Mar. 23, 1971

[73] Assignee Collins Radio Company
Cedar Rapids, Iowa

[54] PHASE DETECTOR WITH IMPROVED DYNAMIC RANGE

16 Claims, 4 Drawing Figs.

[52] U.S. Cl. ... 307/232, 307/255, 307/269, 307/293, 307/304

[51] Int. Cl. ... H03k 7/00

[50] Field of Search ... 307/254, 255, 295, 313, 232, 304, 293

[56] References Cited

UNITED STATES PATENTS

| | | | |
|---|---|---|---|
| 2,863,123 | 12/1958 | Koch | 307/255X |
| 2,891,174 | 6/1959 | Hawkins | 307/295X |
| 2,927,967 | 3/1960 | Edson | 307/255X |
| 3,197,690 | 7/1965 | Ball | 307/255X |
| 3,329,887 | 7/1967 | Schaeve | 307/313X |

*Primary Examiner*—John S. Heyman

*Attorneys*—Warren H. Kintzinger and Robert J. Crawford

ABSTRACT: A combined phase detector and filter with improved dynamic range that may be paralleled without cross interference. Transistor switches are connected to opposite sides of a capacitor in the phase detector with a resistor in series with one of the transistors and with the transistor switches also connected to ground. Control circuitry pulse controls the transistors alternately on and off in mutually opposite relation and the resistor in series with one transistor minimizes capacitor discharge during any simultaneous transistor switched on overlap. An electronic gate is provided in the signal output path of each phase detector and an electronic gate is connected between the signal output circuit path and ground for phase detector discharge reset, and with both of these electronic gates time controlled by circuitry also controlling the switch on and off action of the transistor switches.

PATENTED MAR 23 1971 3,571,619

Figure 4:
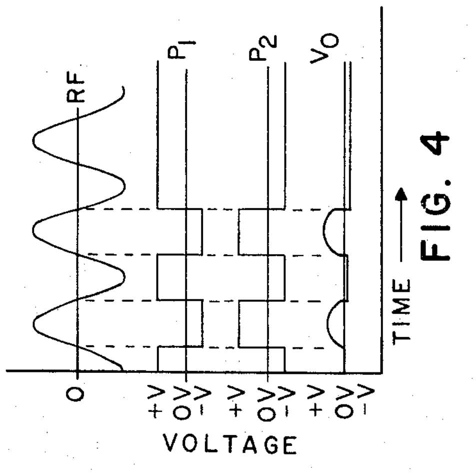

INVENTOR.
NORMAN C. DICKERSON, JR.

BY Warren H. Kintzinger
ATTORNEY

PHASE DETECTOR WITH IMPROVED DYNAMIC RANGE

This invention relates in general to phase detectors, and in particular, to an improved dynamic range relatively high impedance phase detector.

Many phase detectors are low impedance devices that tend to load signal sources and many are transformer coupled signal mixing devices subject to cross interference when used in parallel. Further, the dynamic range capability of many phase detectors is marginal at best and in some instances obviously lacking in performance capabilities to meet the operational requirements imposed in low power signal levels handled with some equipment.

It is, therefore, a principal object of this invention to provide a combined phase detector and filter free from saturation and with significantly increased dynamic range.

Another object is to attain improved isolation of output from input when not signal sampling.

A further object is to provide such a combined phase detector and filter not requiring transformer winding signal coupling in the input to the detector and that may be paralleled without cross interference.

Features of this invention useful in accomplishing the above objects include, in a phase detector with improved dynamic range, an RF signal source connected through an input signal path resistor to a capacitor. The other side of the capacitor is connected serially through a resistor and the emitter collector circuit of a chopper transistor to ground and also to signal output utilizing equipment. The junction of the input signal path resistor and the capacitor is also connected through the emitter collector circuit of a transitor to ground, and pulse transistor control signal circuitry is provided that simultaneously alternately switches one transistor on and the other off for phase sampling and charge stored periods for a DC voltage readout.

Specific embodiments representing what are presently regarded as the best modes of carrying out the invention are illustrated in the accompanying drawing.

Figure 1:
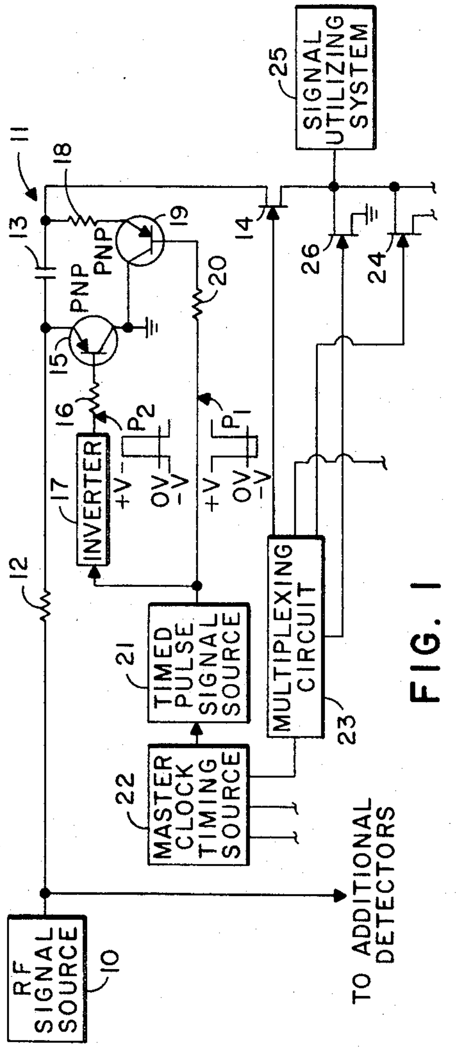
Figure 3:
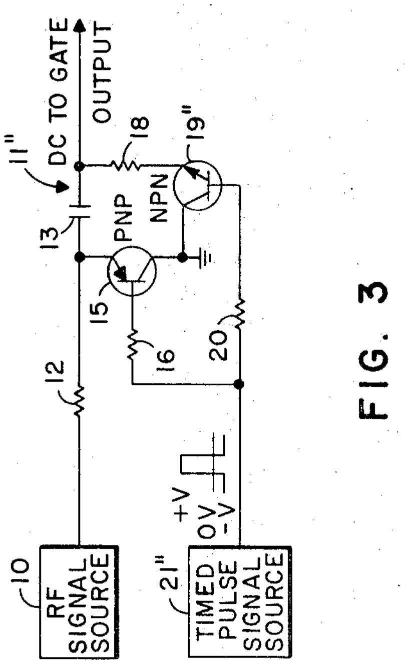
Figure 2:
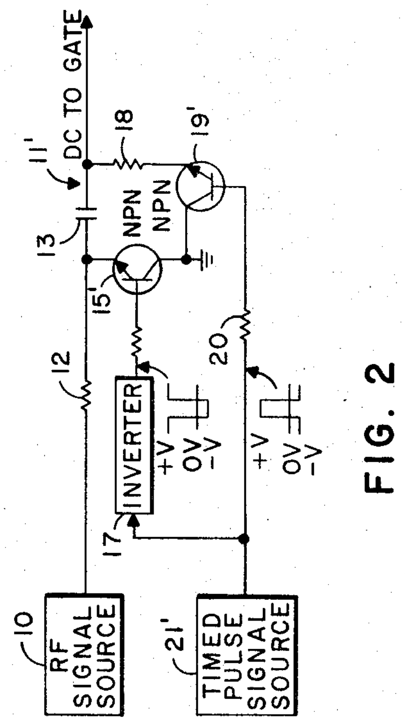

In the drawing:

FIG. 1 represents a schematic and block diagram of a phase detector system with improved dynamic range;

FIG. 2 a partial schematic showing of another phase detector system embodiment;

FIG. 3, a partial schematic of a third phase detector embodiment; and

FIG. 4, signal waveforms applicable to the embodiments of FIGS. 1 and 2 and in part to the embodiment of FIG. 3.

Referring to the drawing:

An RF signal source 10 supplies an input signal to phase detector 11 through input signal path resistor 12. The resistor 12 is connected to one side of capacitor 13 in the phase detector 11 and the other side of capacitor 13 is connected to a gate device that in the embodiment of FIG. 1 takes the form of a field effect transistor (FET) 14. The junction of resistor 12 and capacitor 13 is connected to the emitter of a PNP transistor 15 having a collector connection to ground and a base connection through resistor 16 to the output of signal pulse inverter 17 for pulsed shut off control of the transistor 15. The junction of capacitor 13 and FET 14 is connected through resistor 18 to the emitter of PNP transistor 19. The collector of transistor 19 is connected to ground and the base is connected through resistor 20 to the output of timed pulse signal source 21 for pulsed turn-on control of the transistor 19. The output of timed pulse signal source 21 is also applied as an input to inverter 17 through a signal path connective line therebetween. A master clock timing source 22 provides a timing reference signal input to the timed pulse signal source 21 and also to a multiplexing signal circuit 23 developing an output connected to the control electrode of FET 14. The multiplexing signal circuit 23 may develop a plurality of such outputs as typified by the additional output connection to the control electrode of FET 24 for controlled multiplexing signal inputs through a plurality of such FET's from a corresponding plurality of such phase detectors to signal utilizing system 25 (detail other than for detector 11 only partially shown). An additional control signal output from the multiplexing signal circuit 23 is connected to the control electrode of FET 26 for dumping of the charge on capacitor 13 of phase detector 11 while both PNP transistor 15 and FET 14 are biased to the conductive state for discharge reset with each cycle of operation of the detector 11. The FET 26 is used to perform this same discharge reset function for a number of phase detectors paralleled to feed inputs to signal utilizing system 25 in common. This has been done as a discharge reset both individually for each respective phase detector and also simultaneously for a plurality of paralleled phase detectors with those being discharge reset being simultaneously activated for reset.

The transistors 15 and 19 are controlled so that transistor 15 is on when transistor 19 is off and vice versa. This is with PNP transistor 19 pulsed on by waveform pulses, as shown, out of timed pulse signal source 21 and with the waveform pulse inversion thereof out of inverter 17 pulsing the transistor 15 from the biased to conductive state to the nonconductive state. An RF signal is applied from RF signal source 10 with the phase thereof, with respect to the sample trigger waveform that is generally at the same frequency rate, or cycle period spacing, as the RF signal input, being stored in the form of a DC voltage charge level on the capacitor 13. PNP transistor 19 functions as a chopper transistor that when turned on grounds capacitor 13 through resistor 18 allowing the RF signal to charge capacitor 13 through resistors 12 and 18. In this manner, the phase of the RF signal input with respect to waveform actuating pulses applied at the base of PNP transistor 19 is stored on capacitor 13 in the form of a DC voltage proportional to the cosine of the phase difference. When PNP transistor 15 is on and PNP transistor 19 is off, the DC charge voltage stored on capacitor 13 is referenced to ground to result in the output DC having an opposite polarity to the average polarity of the portion of the RF signal being sampled. While PNP transistor 15 is on and PNP transistor 19 is off during a signal readout time or between signal sampling periods any voltage appearing at the RF input is shorted through PNP transistor 15 to ground. This advantageously protects PNP transistor 19 from breakdown due to overload with high level interference at the RF input. While resistors 12 and 18, capacitor 13 and PNP transistor 19 form a good phase detector, the addition of PNP transistor 15 does materially increase the dynamic range of the detector and sufficiently so to make it adequate for some quite demanding and important application usage. If the resistive value of resistor 12 is equal to the value of resistor 18 the dynamic range of the detector 11 is doubled from the same detector without PNP transistor 15. Further, if the ratio of resistor 12 to resistor 18 is increased from one, the allowable input signal power range is increased proportionally. Please note further, that an additional effect of resistors 12 and 18 and capacitor 13 along with the ratio of on-time to off-time of transistor 19 is to advantageously filter the detected signal.

The detector 11 could be used for some applications in the continually running state with operational parameters optimized for such usage through RC time constant determining resistor and capacitor value selection therefore with capacitor 13 being charged rapidly and tracking variations in phase of the input signal relative to the sampling pulse waveform. In the embodiment of FIG. 1, however, component values are so selected that capacitor 13 does not approach a fully charged state and instead operates in a relatively linear range throughout any phase shifted state of the RF input signal relative to the sampling pulse waveforms. This is with relatively few sample pulses used in each cycle of operation (16 sampling waveform pulses with the embodiment of FIG. 1) and with each cycle of operation including discharge reset. To reiterate, the values of resistors 12 and 18, and capacitor 13 determine the charging time constant that is active during the time PNP transistor 19 is on and PNP transistor 15 is off, and the sampling pulse width to total interval ratio determines the percentage of the RC time constant used in storing charge on capacitor 13 particularly with the stored charge periodically removed in a repetitive uniform cyclic manner for control of the effective charge function integration. Please note that as a practical matter there is some departure from immediate sharp cutoff and turn-on of transistors 15 and 19 and there is some overlapping of on-times of the transistors 15 and 19 with push-pull operation crossover waveforms halfway on and halfway off. However, the resistor 18 limits discharge leakage of the stored charge on capacitor 13 through such relatively brief, minute overlap periods in each cycle of operation. Further, use of PNP transistor 15 in the conductive turned on state referencing the voltage charge on capacitor 13 to ground for readout while resistor 12 forms a high impedance load to a relatively low output impedance RF source advantageously permits parallel usage of many of these detectors driven from a common RF source. Still further, a number of phase detectors such as detector 11 may be paralleled without cross interference such as would be a problem with detectors employing signal coupling transformers in their inputs. As many as eight of the FIG. 1 detectors have been paralleled from the same RF signal source without cross interference.

Components and values used in phase detectors used in parallel from the same RF signal source and in accord with the embodiment of FIG. 1 include the following:

| | |
|---|---|
| Resistors 12 and 18 | 4 K Ohms |
| Capacitor 13 | $0.1\mu f$ |
| FET's 14, 24 and 26 | 2N4391 |
| PNP transistors 15 and 19 | 2N2946A |
| Resistors 16 and 20 | 260 Ohms |
| $P_1$ waveform range | +20 to −5 volts |
| $P_2$ waveform range | −5 to +20 volts |

A phase detector 11 with such associated components and values has been used in sampling an RF signal as shown in FIG. 4 with the RF a predetermined 100 kHz. frequency signal and the $P_1$ and $P_2$ sampling waveforms in the form of double pulsed waveforms to develop the $V_O$ output signal result. As used in a working system a double pulse timed sample is repeated eight times taken $1{,}000\mu$ seconds apart with the $V_0$ DC voltage charge developed being quite adequately held between the eight double sample periods and with the ultimate charge levels attained for $V_O$ being still within the substantially linear range of the RC time constant charge characteristic charge curve. This is with sample actuating pulses being substantially $5\mu$ seconds long and one-half the RF signal cycle $10\mu$ second period. There is a trade off in signal characteristics in going to one-half a signal cycle sampling pulse in optimizing the resulting signal to noise ratio and other operational results. However, exceeding one-half cycle sampling intervals does not appear desirable although in the alternative there are cases for less than one-half cycle sampling intervals. After the last of the eight double sample periods with the $V_O$ DC voltage charge being held approximately $100\mu$ seconds thereafter FET 14 is activated for approximately $160\mu$ seconds the last approximately $100\mu$ seconds of which there is simultaneous activation of FET 26 to conduction. Thus, for approximately the first $60\mu$ seconds of the $160\mu$ second activation of FET 14 the signal is available as a phase detector output $V_O$ signal to signal utilizing system 25 and then through the $100\mu$ second interval of simultaneous FET 14 and FET 26 activation to the conductive state discharge reset is provided for the phase detector 11. This helps insure that the $V_O$ output developed is always substantially a linear readout of the phase relation between the sampling pulses and the RF signal input on a predictably reliable basis. Further, as a result, the same phase detector may be used for reading different RF input signals and thereby eliminate any detector-imparted bias in comparing the signal result readouts relative to the signals received from different sources being compared.

The phase detector 11′ of FIG. 2 is quite similar to the phase detector 11 of FIG. 1 and components the same are numbered the same and those that are some different are given primed numbers as a matter of convenience. With this embodiment NPN transistors 15′ and 19′ are used in place of the PNP transistors 15 and 19 of the FIG. 1 embodiment, and timed pulse signal source 21′ generates a $P_2$ pulsed waveform for activating NPN transistor 19′ and the inverted waveform $P_1$ appearing at the output of inverter 17 in FIG. 2 is used for actuating NPN transistor 15′. With these variations in mind, the waveforms of FIG. 4, and the description and operation set forth for the embodiment of FIG. 1 are substantially equally applicable to the embodiment of FIG. 2 and are not, therefore, repeated in such detail here.

Referring now to the phase detector 11″ embodiment of FIG. 3, the only transistor change from the embodiment of FIG. 1 is NPN transistor 19″ used in place of PNP transistor 19 with PNP transistor 15 remaining the same. Here again, those components the same as in the embodiment of FIG. 1 are given the same numbers as a matter of convenience. With this embodiment timed pulse signal source 21″ generates a $P_2$ pulsed waveform that is applied directly through both resistor 16 to the base of PNP transistor 15 and resistor 20 to the base of NPN transistor 19″ without any inverter 17 (of FIG. 1) being required to obtain the operational alternate off-on action of the transistors as with the FIGS. 1 and 2 embodiments. The $P_1$ waveform of FIG. 4 is not used with the embodiment of FIG. 3 but the other waveforms are applicable and description with respect to FIG. 1 is generally applicable with respect hereto.

Whereas this invention is herein illustrated and described with respect to specific embodiments thereof, it should be realized that various changes may be made without departing from the essential contributions to the art made by the teachings hereof.

I claim:

1. In a phase detector system circuit: alternating signal source connective means; first resistive means in a signal input path from said alternating signal source means to a phase detector; said first resistive means connected to the first side of a capacitor; said capacitor having second side output connective means, and a connection through second resistive means and a first electronic switch and a voltage potential reference source; with said second resistive means and said electronic switch connected in series relation between said capacitor second side and said voltage potential reference source; a second electronic switch connected between the junction of said first resistive means and said capacitor, and said voltage potential reference source; and signal circuit control means connected to said first and second electronic switches for simultaneously alternately switching one of said electronic switches on and the other electronic switch off.

2. The phase detector system circuit of claim 1 wherein, said alternating signal connective means is connected to RF signal means for application of RF signal inputs to said phase detector; and wherein said first and second electronic switches are transistors with the emitters circuit connected to opposite respective sides of said capacitor, collectors connected to said voltage potential reference source, and with bases connected to said signal circuit control means.

3. The phase detector system circuit of claim 2 wherein, resistive means is included in each transistor base to signal circuit control means connection; and said voltage potential reference source is ground.

4. The phase detector system circuit of claim 3 wherein, said circuit control means includes timed pulse signal source means supplying pulses at a predetermined rate time related to the frequency of the RF signal inputs through the respective resistive means connected to the bases of said transistors.

5. The phase detector system circuit of claim 4 wherein, one of said transistors is a PNP transistor and the other is a NPN transistor.

6. The phase detector system circuit of claim 4 wherein, both of said transistors are like transistors; and a signal inverter is included in the connection between said timed pulse signal source means and the base of one of said transistors.

7. The phase detector system circuit of claim 6 wherein, both of said transistors are PNP transistors and the output of said timed pulse signal source means is a negative going pulse applied through a resistor to the base of the transistor comprising said first electronic switch; and with the negative going pulse also being the input to said signal inverter and the resulting positive going pulse inverter output being connected through a resistor to the base of the transistor comprising said second electronic switch.

8. The phase detector system circuit of claim 6 wherein, both of said transistors are NPN transistors and the output of said timed pulse signal source means is a positive going pulse applied through a resistor to the base of the transistor comprising said first electronic switch; and with the positive going pulse also being the input to said signal inverter and the resulting negative going pulse inverter output being connected through a resistor to the base of the transistor comprising said second electronic switch.

9. The phase detector system circuit of claim 1 wherein, the second side output connective means of said capacitor includes a first electronic gate with a control electrode connected to said signal circuit control means.

10. The phase detector system circuit of claim 9 wherein, said signal circuit control means includes clock-timing control source means and multiplexing circuit means connected to the control electrode of said first electronic gate; and with the first electronic gate an FET.

11. The phase detector system circuit of claim 9 also including a second electronic gate with its control electrode also connected to said signal circuit control means; with said first electronic gate completing the output circuit to signal output utilizing means when gate controlled to conduction; and with said second gate connected between the output signal circuit path and said voltage potential reference source to complete a circuit connection therebetween when gate controlled to conduction.

12. The phase detector system circuit of claim 11 wherein, both of said first and second electronic gates are each an FET; and with the FET comprising said second electronic gate connected to the output signal path between said first electronic gate and signal output means connected for receiving the gated output of the phase detector.

13. The phase detector system circuit of claim 11 wherein, a plurality of such phase detector circuits are connected through individual electronic gates each the equivalent of said first electronic gate with respect to the associated phase detector circuit of the plurality of phase detector circuits to feed gated outputs to a common connection to output utilizing means.

14. The phase detector system circuit of claim 13 wherein, said second gate is connected to said common connection to output utilizing means for discharge reset of parallel connected phase detector circuits.

15. The phase detector system circuit of claim 1 wherein, the ratio of the value of said first resistive means to the value of said second resistive means is a ratio in the range from approximately one to relatively high ratio values.

16. The phase detector system circuit of claim 15 wherein, the value of said second resistor relative to the value of said capacitor results in RC time constant characteristics preventing any significant discharge of stored charge on said capacitor during any overlap on in the on-off action of said first and second electronic switches in mutually opposite alternating controlled switch-on and switch-off control thereof.